US00RE50581E

(19) United States
(12) Reissued Patent
Kim

(10) Patent Number: US RE50,581 E
(45) Date of Reissued Patent: *Sep. 2, 2025

(54) CAPACITOR DEVICE, ORGANIC LIGHT EMITTING DISPLAY APPARATUS INCLUDING THE CAPACITOR DEVICE, AND METHOD OF MANUFACTURING THE ORGANIC LIGHT EMITTING DISPLAY APPARATUS

(71) Applicant: SAMSUNG DISPLAY CO., LTD., Yongin-si (KR)

(72) Inventor: Hyun-Tae Kim, Yongin-si (KR)

(73) Assignee: Samsung Display Co., Ltd., Yongin-si (KR)

( * ) Notice: This patent is subject to a terminal disclaimer.

(21) Appl. No.: 18/104,080

(22) Filed: Jan. 31, 2023

Related U.S. Patent Documents

Reissue of:
(64) Patent No.: 9,466,652
Issued: Oct. 11, 2016
Appl. No.: 14/875,611
Filed: Oct. 5, 2015

U.S. Applications:
(60) Continuation of application No. 17/171,900, filed on Feb. 9, 2021, now Pat. No. Re. 49,405, which is a (Continued)

(30) Foreign Application Priority Data

Apr. 4, 2013 (KR) ..... 10-2013-0036978

(51) Int. Cl.
*H10K 59/121* (2023.01)
*G09G 3/3225* (2016.01)
(Continued)

(52) U.S. Cl.
CPC ..... *H10K 59/1216* (2023.02); *G09G 3/3225* (2013.01); *H10D 1/692* (2025.01); (Continued)

(58) Field of Classification Search
CPC ..... H01L 27/3265; H01L 27/3262; H01L 27/3276; H01L 28/60; H01L 2227/323; (Continued)

(56) References Cited

U.S. PATENT DOCUMENTS 6,887,100 B2 5/2005 Matsueda et al.
8,653,541 B2 2/2014 Ikeda et al.
(Continued)

FOREIGN PATENT DOCUMENTS

JP 3922374 B2 5/2007
KR 10-0517251 A 9/2005
(Continued)

OTHER PUBLICATIONS

Korean Patent Abstracts Publication No. 1020040059037 A, dated Jul. 5, 2004, for corresponding Patent KR 10-0517251 A listed above, 11 pages.

*Primary Examiner* — Minh Nguyen
(74) *Attorney, Agent, or Firm* — Womble Bond Dickinson (US) LLP

(57) ABSTRACT

A capacitor device includes two top capacitor electrodes separated from each other and symmetrical to each other, two intermediate capacitor electrodes symmetrical to each other and respectively overlapping the top capacitor electrodes, a bridge coupling the intermediate capacitor electrodes without overlapping the top capacitor electrodes, and a driving voltage line coupled to the bridge and configured to apply a common voltage to the intermediate capacitor electrodes.

17 Claims, 15 Drawing Sheets

Related U.S. Application Data continuation of application No. 16/116,853, filed on Aug. 29, 2018, now Pat. No. Re. 48,432, which is an application for the reissue of Pat. No. 9,466,652, which is a division of application No. 13/959,643, filed on Aug. 5, 2013, now Pat. No. 9,165,993.

(51) Int. Cl.

| | |
|---|---|
| ***H10D 1/68*** | (2025.01) |
| ***H10D 86/40*** | (2025.01) |
| ***H10D 86/60*** | (2025.01) |
| ***H10K 59/12*** | (2023.01) |
| ***H10K 59/131*** | (2023.01) |

(52) U.S. Cl.

CPC ..... *H10D 86/441* (2025.01); *H10D 86/481* (2025.01); *H10D 86/60* (2025.01); *H10K 59/1213* (2023.02); *H10K 59/131* (2023.02); *G09G 2300/043* (2013.01); *G09G 2300/0852* (2013.01); *G09G 2310/0216* (2013.01); *G09G 2310/0251* (2013.01); *H10K 59/1201* (2023.02)

(58) Field of Classification Search

CPC ..... G09G 3/3225; G09G 2300/043; G09G 2300/0852; G09G 2310/0216; G09G 2310/0251

See application file for complete search history.

(56) References Cited

U.S. PATENT DOCUMENTS

| | | | |
|---|---|---|---|
| 8,686,926 | B2 | 4/2014 | Han et al. |
| 8,878,827 | B2 | 11/2014 | Han et al. |
| 2010/0201673 | A1 | 8/2010 | Kim et al. |
| 2010/0270678 | A1 | 10/2010 | Ikeda |
| 2012/0105388 | A1 | 5/2012 | Han |

FOREIGN PATENT DOCUMENTS

| | | | |
|---|---|---|---|
| KR | 10-2005-0104605 | A | 11/2005 |
| KR | 10-2010-0071708 | A | 6/2010 |
| KR | 10-2010-0116553 | A | 11/2010 |
| KR | 10-2012-0008085 | A | 1/2012 |
| KR | 10-2012-0044657 | A | 5/2012 |

CAPACITOR DEVICE, ORGANIC LIGHT EMITTING DISPLAY APPARATUS INCLUDING THE CAPACITOR DEVICE, AND METHOD OF MANUFACTURING THE ORGANIC LIGHT EMITTING DISPLAY APPARATUS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

[This application is a divisional of U.S. patent application Ser. No. 13/959,643, filed Aug. 5, 2013, which claims priority to and the benefit of Korean Patent Application No. 10-2013-0036978, filed Apr. 4, 2013, the entire content of both of which is incorporated herein by reference.] *This application is a continuation reissue of application Ser. No. 17/171,900, filed on Feb. 9, 2021, now U.S. Pat. No. Re49,405, which is a continuation reissue of application Ser. No. 16/116,853, filed on Aug. 29, 2018, now U.S. Pat. No. Re48,432, which is an application for reissue of U.S. Pat. No. 9,466,652, issued on Oct. 11, 2016, and filed as U.S. Divisional application Ser. No. 14/875,611, on Oct. 5, 2015, which is a divisional of U.S. patent application Ser. No. 13/959,643, filed Aug. 5, 2013, now U.S. Pat. No. 9,165,993, and claims priority to and the benefit of Korean Patent Application No. 10-2013-0036978, filed in the Korean Intellectual Property Office on Apr. 4, 2013, the entire content of each of which is incorporated herein by reference.*

BACKGROUND

1. Field

The aspects of embodiments of the present invention relate to capacitor devices in pixels, an organic light-emitting display apparatus including the capacitor devices, and a method for manufacturing the organic light-emitting display apparatus.

2. Description of the Related Art

An organic light emitting display apparatus may include two electrodes and an organic emissive layer therebetween, wherein an electron that is injected into one electrode, and a hole that is injected into the other electrode, combine in an organic emissive layer to form an exciton, and light is emitted as the exciton emits energy.

The organic light emitting display apparatus may include a plurality of pixels that include an organic light emitting device (which is a self-emissive device), a plurality of thin film transistors (TFTs), and at least one capacitor formed in each pixel to drive the organic light emitting device.

The capacitor may be formed of a bottom electrode and a top electrode, with a dielectric body interposed therebetween. A charging capacitance of the capacitor is proportional to a surface area of the two overlapping electrodes. Accordingly, when the surface area of the two electrodes is reduced, the charging capacitance of the capacitor may also be reduced. However, to apply a voltage to an electrode of a capacitor, a structure, such as a contact hole, is used, and when the contact hole is formed, the surface area of the two electrodes may decrease. Thus, capacitor devices can be redesigned.

SUMMARY

The aspects of embodiments of the present invention are directed toward capacitor devices with increased capacitance, an organic light emitting display apparatus including the capacitor devices, and a method for manufacturing the organic light emitting display apparatus.

According to an aspect of an embodiment of the present invention, there is provided a capacitor device including two top capacitor electrodes separated from each other and symmetrical to each other, two intermediate capacitor electrodes symmetrical to each other and respectively overlapping the top capacitor electrodes, a bridge coupling the intermediate capacitor electrodes without overlapping the top capacitor electrodes, and a driving voltage line coupled to the bridge and configured to apply a common voltage to the intermediate capacitor electrodes.

The capacitor device may further include an insulation layer located between the top capacitor electrodes and the intermediate capacitor electrodes, and defining a contact hole to expose the bridge, and the driving voltage line may be coupled with the bridge via the contact hole.

An entirety of each of the top capacitor electrodes may overlap with a respective one of the intermediate capacitor electrodes.

The capacitor device may further include two bottom capacitor electrodes that are symmetrical to each other and located below the intermediate capacitor electrodes, the bottom capacitor electrodes being insulated from, and overlapping with, the intermediate capacitor electrodes.

The capacitor device may further include a contact node electrically coupling the bottom capacitor electrodes, and electrically coupling the top capacitor electrodes, via storage opening portions defined by the top capacitor electrodes and by the intermediate capacitor electrodes, the storage opening portions exposing the bottom capacitor electrodes.

According to another aspect of an embodiment of the present invention, there is provided an organic light emitting display apparatus including two pixels symmetrical to each other, located on a substrate, and adjacent each other in a first direction, each of the pixels including a pixel circuit and an organic light emitting diode (OLED), two top capacitor electrodes separated from each other and symmetrical to each other, each of the top capacitor electrodes being respectively located in one of the pixel circuits, two intermediate capacitor electrodes symmetrical to each other and insulated from, and overlapping with, the top capacitor electrodes, a bridge coupling the intermediate capacitor electrodes without overlapping the top capacitor electrodes, and a driving voltage line coupled to the bridge, and configured to apply a common voltage to the intermediate capacitor electrodes.

An entirety of each of the top capacitor electrodes may overlap with a respective one of the intermediate capacitor electrodes.

The organic light emitting display apparatus may further include two bottom capacitor electrodes symmetrical to each other and located below the intermediate capacitor electrodes, the bottom capacitor electrodes being insulated from, and overlapping with, the intermediate capacitor electrodes.

The organic light emitting display apparatus may further include a contact node electrically coupling the bottom capacitor electrodes to each other, and electrically coupling the top capacitor electrodes to each other, via storage opening portions defined by the top capacitor electrodes, and by the intermediate capacitor electrodes, to expose the bottom capacitor electrodes.

The contact node may be configured to apply an initialization voltage during an initialization period.

The organic light emitting display apparatus may further include a driving thin film transistor (TFT) including a gate electrode that is the bottom capacitor electrodes, and an active layer insulated from the bottom capacitor electrodes.

The driving voltage line may include a plurality of first driving voltage lines extending in a second direction crossing the first direction and configured to apply the common voltage to the pixels, and a second driving voltage line coupled to the bridge and extending in the first direction.

The plurality of first driving voltage lines and the second driving voltage line may be a mesh structure configuration.

The first driving voltage lines may be separated from one another and arranged symmetrically.

According to another aspect of an embodiment of the present invention, there is provided a method for manufacturing an organic light emitting display apparatus, the method including forming two separate bottom capacitor electrodes on a substrate in two pixel areas, respectively, the pixel areas being symmetrical to each other, and being adjacent each other in a first direction, forming two intermediate capacitor electrodes coupled to each other via a bridge, and overlapping with the bottom capacitor electrodes, forming two separate top capacitor electrodes that are insulated from, and overlap with, the intermediate capacitor electrodes without overlapping the bridge, forming an insulation layer covering the top capacitor electrodes, forming a contact hole in the insulation layer to expose the bridge, and forming a driving voltage line at the insulation layer and coupled to the bridge.

An entirety of each of the top capacitor electrodes may overlap with a respective one of the intermediate capacitor electrodes.

The top capacitor electrodes and the intermediate capacitor electrodes may define a plurality of storage opening portions to expose the bottom capacitor electrodes, and the method may further include forming a contact node at the insulation layer to electrically couple the bottom capacitor electrodes to each other, and to electrically couple the top capacitor electrodes to each other, via the plurality of storage opening portions.

The driving voltage line may include a plurality of first driving voltage lines configured to supply a voltage to the two pixel areas and extending in a second direction orthogonal to the first direction, and a second driving voltage line coupled to the bridge and extending in the first direction.

The plurality of first driving voltage lines and the second driving voltage line may be a mesh structure configuration.

The first driving voltage lines may be separated from one another and may be arranged symmetrically.

BRIEF DESCRIPTION OF THE DRAWINGS

The aspects of embodiments of the present invention will become more apparent by describing detailed example embodiments thereof with reference to the attached drawings in which.

DETAILED DESCRIPTION

Figure 1:
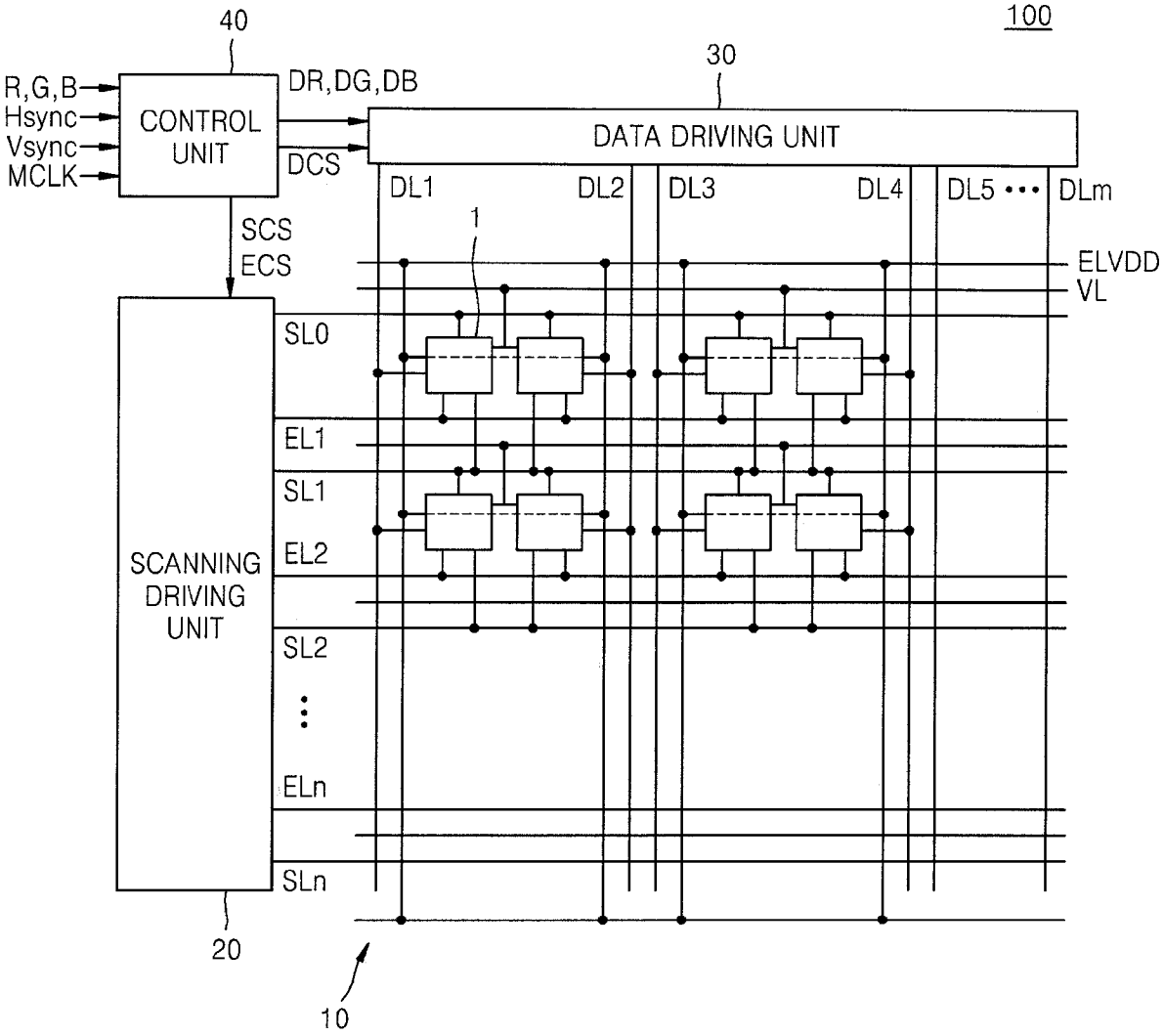
FIG. 1 is a schematic block diagram illustrating an organic light emitting display apparatus according to an embodiment of the present invention.

The structures and operations according to various embodiments of the present invention will now be described more fully with reference to the accompanying drawings, in which example embodiments of the invention are shown.

In the description of embodiments of the present invention, certain detailed explanations of related art may be omitted when it is deemed that they may unnecessarily obscure the essence of the invention. In the drawings, thicknesses and areas may be shown expanded or exaggerated to clearly illustrate layers and regions.

Throughout the specification, the same or similar elements are labeled with like reference numerals. In the present specification, terms such as "first" and "second" are used for the purpose of distinguishing one constituent element from another constituent element, and the constituent elements are not necessarily limited by the terms. It will also be understood that when a portion such as a layer, a region, or an element is referred to as being "on" another portion, it can be directly on the other portion, or one or more intervening elements may also be present. Further, expressions such as "at least one of," when preceding a list of elements, modify the entire list of elements, and do not modify the individual elements of the list.

FIG. 1 is a block diagram illustrating an organic light emitting display apparatus 100 according to an embodiment of the present invention. The organic light emitting display apparatus 100 includes a display unit 10 that includes a plurality of pixels, a scanning driving unit 20, a data driving unit 30, and a control unit 40. The scanning driving unit 20, the data driving unit 30, and the control unit 40 may be formed in different semiconductor chips, or may be integrated in a single semiconductor chip. The scanning driving unit 20 may be formed on the same substrate as the display unit 10.

The display unit 10 includes a plurality of scanning lines SL0 through SLn and a plurality of emission control lines EL1 through ELn cross a plurality of data lines DL1 through DLm, and also includes a plurality of pixels 1 that are arranged approximately in a matrix configuration.

Each pixel 1 is coupled to two of the scanning lines SL0 through SLn in the display unit 10. While each pixel 1 is shown in the embodiment of FIG. 1 as being coupled to a scanning line corresponding to a corresponding pixel line, and as being coupled to a scanning line of a pixel line that is previous to the corresponding pixel line (e.g., numerically previous, or prior in a scanning direction), the embodiments of the present invention are not limited thereto.

Also, each pixel 1 is also coupled to one of the plurality of data lines DL1 through DLm, and to one of the plurality of emission control lines EL1 through ELn.

Also, each pixel 1 is also coupled to one of a plurality of initialization voltage lines VL (through which an initialization voltage can be supplied), and to one of a plurality of driving voltage lines PL (through which a first power voltage ELVDD can be supplied).

According to an embodiment of the present invention, two adjacent pixels are symmetrical to each other with respect to an axis extending in a direction in which the data lines DL1 through DLm extend. That is, the two adjacent pixels are symmetrical to each other with respect to a column line (e.g., in a vertical direction). The two symmetrical adjacent pixels share an initialization voltage line VL that is arranged along a row line. A plurality of driving voltage lines PL (see FIG. 4) that are arranged in columns (e.g., in the vertical direction), which correspond to the two adjacent symmetrical pixels, are separated from one another (e.g., by a predetermined distance, or a set distance) and are parallel to each other. The two driving voltage lines PL (see FIG. 4) that are symmetrical to each other with respect to the column line are coupled to each other via a driving voltage line PL (see FIG. 4) arranged along a row line (e.g., in a horizontal direction), thereby forming a mesh structure.

The scanning driving unit 20 generates two corresponding scanning signals, and may transfer the corresponding scanning signals to each pixel via respective ones of the plurality of scanning lines SL0 through SLn. That is, the scanning driving unit 20 may transfer a first scanning signal via a first scanning line in which corresponding pixels are included, and may transfer a second scanning signal via a second scanning line that is previous to the first scanning line. For example, the scanning driving unit 20 may transfer a first scanning signal Sn to a pixel at an n-th row line and an m-th column line via an n-th scanning line SLn, and may also transfer a second scanning signal Sn-1 via an (n-1)-th scanning line SLn-1. Also, the scanning driving unit 20 generates an emission control signal(s) EM1 through EMn, and may transfer the emission control signal EM1 through EMn to each pixel via the plurality of emission control lines EL1 through ELn. According the present embodiment, a scanning signal (e.g., Sn) and an emission control signal (e.g., EMn) are generated in the same scanning driving unit 20, although the present invention is not limited thereto. For example, the display apparatus 100 may further include an emission control driving unit, that generates the emission control signal.

In the present embodiment, the data driving unit 30 may transfer data signals D1 through Dm to respective pixels 1 via a plurality of data lines DL1 through DLm.

In the present embodiment of the present invention, the control unit 40 converts a plurality of externally generated image signals R, G, and B (e.g., external to the control unit 40) to a plurality of image data signals DR, DG, and DB, and may then transfer the plurality of image data signals DR, DG, DB to the data driving unit 30. Also, the control unit 40 can receive a vertical synchronization signal Vsync, a horizontal synchronization signal Hsync, and a clock signal MCLK to generate a control signal for controlling driving of the scanning driving unit 20 and of the data driving unit 30. The control unit 40 may transfer the control signal to the scanning driving unit 20 and the data driving unit 30, respectively. For example, the control unit 40 generates a scanning driving control signal SCS and an emission driving control signal ECS for controlling the scanning driving unit 20, and a data driving control signal DCS for controlling the data driving unit 30, and may transfer the scanning driving control signal SCS and the emission driving control signal ECS to the scanning driving unit 20, and may transfer the data driving control signal DCS to the data driving unit 30.

Each of the pixels 1 emits light (e.g., light of a predetermined luminance) according to a driving current $I_{oled}$ (see FIG. 2) that is supplied to the organic light emitting diode OLED according to the data signals D0 through Dm transferred via the plurality of data lines DL1 through DLm.

Figure 2:
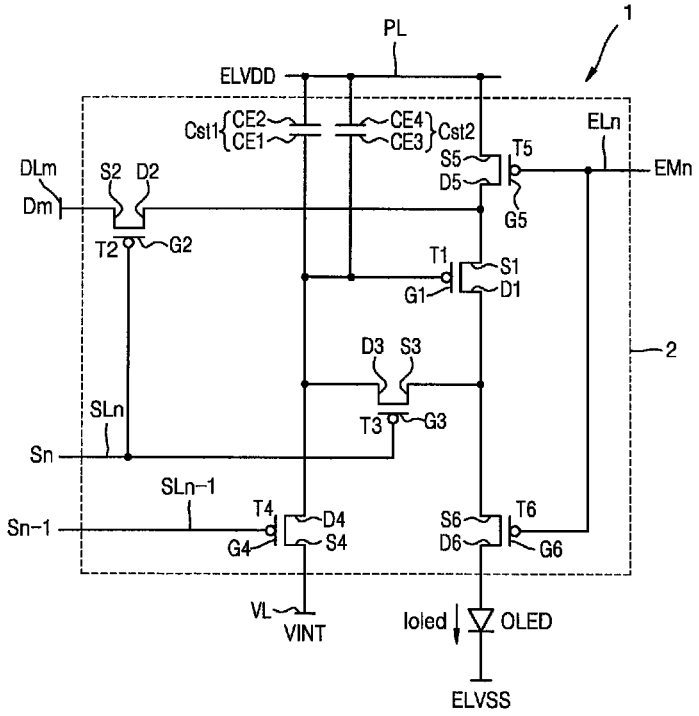
FIG. 2 is an equivalent circuit diagram of a pixel of a display apparatus according to an embodiment of the present invention.
Figure 3:
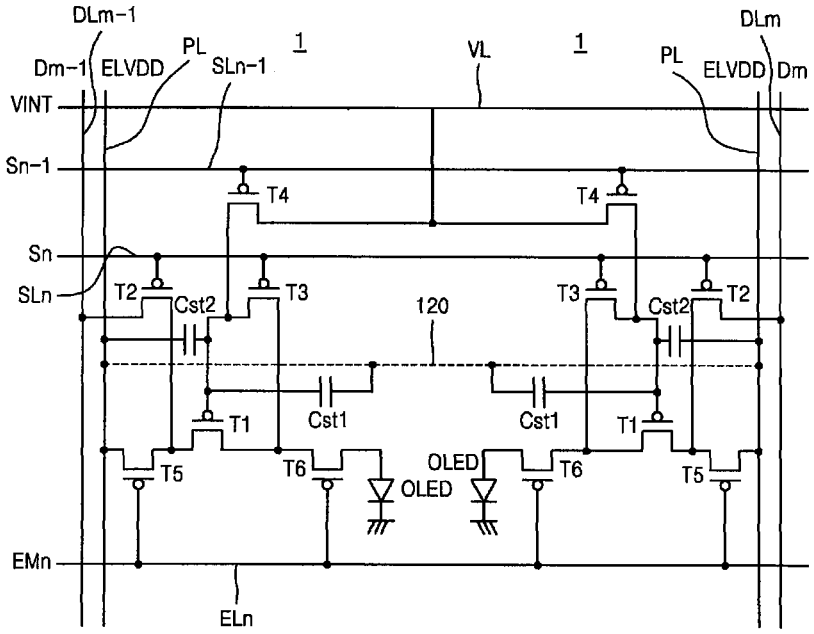
FIG. 3 is a schematic circuit diagram of two adjacent pixels of a display apparatus according to an embodiment of the present invention.

FIG. 2 is an equivalent circuit diagram of a pixel 1 of a display apparatus 100 according to an embodiment of the present invention. FIG. 3 is a schematic circuit diagram of two adjacent pixels 1 of a display apparatus 100 according to an embodiment of the present invention.

The pixel 1 illustrated in FIGS. 2 and 3 represents one of a plurality of pixels at an n-th row line, and is coupled to a scanning line SLn corresponding to the n-th row line, and is also coupled to a scanning line SLn-1 corresponding to an (n-1)-th row line which is a previous line of the n-th row line.

The pixel 1 of the organic light, emitting display apparatus 100 according to the present embodiment includes a pixel circuit 2, which includes a plurality of thin film transistors (TFTs) T1 through T6 and a plurality of storage capacitors Cst1 and Cst2. The pixel 1 also includes an OLED that receives a driving voltage via the pixel circuit 2 to emit light.

In the present embodiment of the present invention, the TFTs T1 through T6 comprise a driving TFT T1, a switching TFT T2, a compensation TFT T3, an initialization TFT T4, a first emission control TFT T5, and a second emission control TFT T6.

The pixel 1 includes a first scanning line SLn, through which a first scanning signal Sn is transferred to the switching TFT T2 and the compensation TFT T3, a second scanning line SLn-1, which is a previous scanning line, that transfers a second scanning signal Sn-1 to the initialization TFT T4, an emission control line ELn that transfers an emission control signal EMn to the first emission control TFT T5 and the second emission control TFT T6, a data line DLm that crosses the first scanning line SLn, and through which a data signal Dm is transferred, a driving voltage line PL that transfers a first power voltage ELVDD and is substantially parallel to the data line DLm, and an initialization voltage line VL, through which an initialization voltage VINT for initializing the driving TFT T1 is transferred, and is substantially parallel to the second scanning line SLn-1.

A gate electrode G1 of the driving TFT T1 is coupled to a first electrode CE1 of the storage capacitor Cst1. A source electrode S1 of the driving TFT T1 is coupled to the driving voltage line PL through operation of the first emission control TFT T5. A drain electrode D1 of the driving TFT T1 is coupled to an anode electrode of the OLED through operation of the second emission control TFT T6. The driving TFT T1 receives the data signal Dm according to a switching operation of the switching TFT T2 to supply a driving current $I_{oled}$ to the OLED.

A gate electrode G2 of the switching TFT T2 is coupled to the first scanning line SLn. A source electrode S2 of the switching TFT T2 is coupled to the data line DLm. A drain electrode D2 of the switching TFT T2 is coupled to the source electrode S1 of the driving TFT T1, and is also coupled to the driving voltage line PL through operation of the first emission control TFT T5. The switching TFT T2 is turned on according to the first scanning signal Sn that is received through the first scanning line SLn to thereby transfer the data signal Dm from the data line Dm to the source electrode S1 of the driving TFT T1.

A gate electrode G3 of the compensation TFT T3 is coupled to the first scanning line SLn. A source electrode S3 of the compensation TFT T3 is coupled to a drain electrode D1 of the driving TFT T1, and is also coupled to an anode electrode of the OLED through operation of the second emission control TFT T6. A drain electrode D3 of the compensation TFT T3 is coupled to the first electrode CE1 of the storage capacitor Cst1, to a drain electrode D4 of the initialization TFT T4, and to the gate electrode G1 of the driving TFT T1. The compensation TFT T3 is turned on according to a first scanning signal Sn that is received via the first scanning line SLn, thereby coupling the gate electrode G1 to the drain electrode D1 of the driving TFT T1 to diode-connect the driving TFT T1.

A gate electrode G4 of the initialization TFT T4 is coupled to a second scanning line SLn-1. A source electrode S4 of the initialization TFT T4 is coupled to an initialization voltage line VL. A drain electrode D4 of the initialization TFT T4 is coupled to the first electrode CE1 of the storage capacitor Cst1, to a drain electrode D3 of the compensation TFT T3, and to the gate electrode G1 of the driving TFT T1. The initialization TFT T4 is turned on according to the second scanning signal Sn-1 received via the second scanning line SLn-1 to transfer an initialization voltage VINT to the gate electrode G1 of the driving TFT T1, thereby performing an initialization operation of initializing a voltage of the gate electrode G1 of the driving TFT T1.

A gate electrode G5 of the first emission control TFT T5 is coupled to the emission control line ELn. A source electrode S5 of the first emission control TFT T5 is coupled to the driving voltage line PL. A drain electrode D5 of the first emission control TFT T5 is coupled to the source electrode S1 of the driving TFT T1 and to the drain electrode D2 of the switching TFT T2.

A gate electrode G6 of the second emission control TFT T6 is coupled to the emission control line ELn. A source electrode S6 of the second emission control TFT T6 is coupled to the drain electrode D1 of the driving TFT T1 and the source electrode S3 of the compensation TFT T3. The drain electrode D6 of the second emission control TFT T6 is coupled to the anode of the OLED. The first emission control TFT T5 and the second emission control TFT T6 are turned on (e.g., turned on simultaneously) according to the emission control signal EMn that is received via the emission control line ELn, so that a first power voltage ELVDD is thereby transferred to the OLED, causing a driving current $I_{oled}$ to flow in the OLED.

A second electrode CE2 of the first storage capacitor Cst1 is coupled to the driving voltage line PL. The first electrode CE1 of the first storage capacitor Cst1 is coupled to the gate electrode G1 of the driving TFT T1, the drain electrode D3 of the compensation TFT T3, and the drain electrode D4 of the initialization TFT T4.

A fourth electrode CE4, which is of the second storage capacitor Cst2, is also coupled to the driving voltage line PL. A third electrode CE3, which is of the second storage capacitor Cst2, is also coupled to the gate electrode G1 of the driving TFT T1, the drain electrode D3 of the compensation TFT T3, and the drain electrode D4 of the initialization TFT T4.

The first storage capacitor Cst1 and the second storage capacitor Cst2 are coupled to each other in parallel. The first storage capacitor Cst1 and the second storage capacitor Cst2 are configured to store a data signal (e.g., Dm) supplied to a pixel 1 during a data programming period, and to maintain the data signal during one frame.

A cathode electrode of the OLED is coupled to a second power voltage ELVSS. The OLED receives a driving current $I_{oled}$ from the driving TFT T1 to display an image. The first power voltage ELVDD may be a high level voltage (e.g., a predetermined high level voltage), and the second power voltage ELVSS may be a voltage that is lower than the first power voltage ELVDD, or may be a ground voltage.

Referring to FIG. 3, according to the present embodiment, an initialization voltage line VL (through which an initialization voltage VINT is supplied), a first scanning line SLn (through which a first scanning signal Sn is supplied), a second scanning line SLn-1 (through which a second scanning signal Sn-1 is supplied), and an emission control line ELn (through which an emission control signal EMn is supplied), are arranged in parallel in a horizontal direction. Also, two data lines DLm-1 and DLm and a driving voltage line PL are arranged in parallel in a vertical direction that is substantially orthogonal to the horizontal direction.

Two adjacent pixels 1 share the initialization voltage line VL, and are formed such that the data lines DLm-1 and DLm and the driving voltage lines PL are separated from each other (e.g., by a predetermined or a set distance). The driving voltage lines PL that face each other are coupled to one another via a connection wiring 120 extending in the horizontal direction, such that the driving voltage lines PL and the connection wiring 120 collectively form a mesh structure, thereby supplying power in both horizontal and vertical directions. Accordingly, an area of wirings for supplying power is further extended, thereby preventing a voltage drop due to a resistance of the wirings.

According to the present embodiment, two adjacent pixels 1 share the initialization voltage line VL such that the two adjacent pixels 1 are symmetrical in structure. Accordingly, a vertical data line DLm-1 along a vertical direction and a vertical driving voltage line PL are at a left outer portion of the left pixel 1, and a vertical data line DLm and a vertical driving voltage line PL are at a right outer portion of the right pixel 1. Accordingly, other signal wirings of the same layer are not between the two vertical driving voltage lines PL of the left and right pixels 1. The two vertical driving voltage lines PL may be coupled to each other via the connection wiring 120 that is formed at the same layer as, and at the same time as, the vertical driving voltage lines PL.

Figure 4:
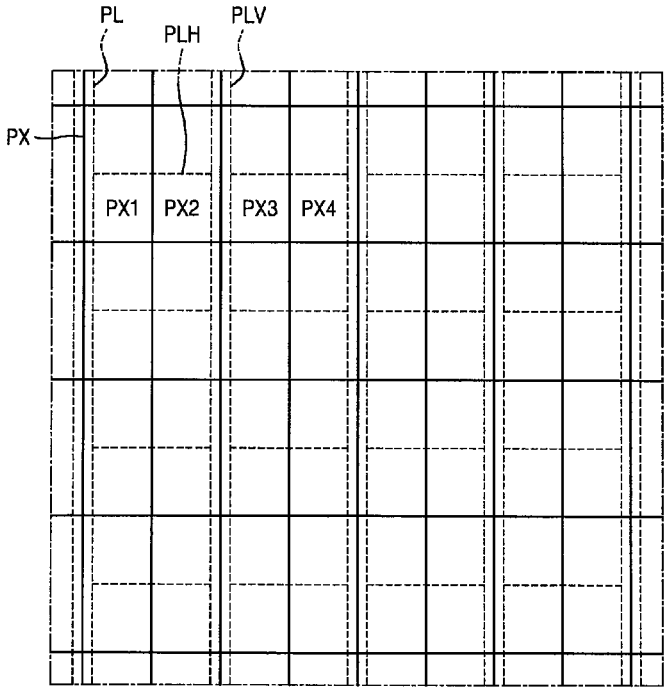
FIG. 4 is a view for explaining a mesh structure of driving voltage lines PL of a display apparatus according to an embodiment of the present invention.
Figure 5:
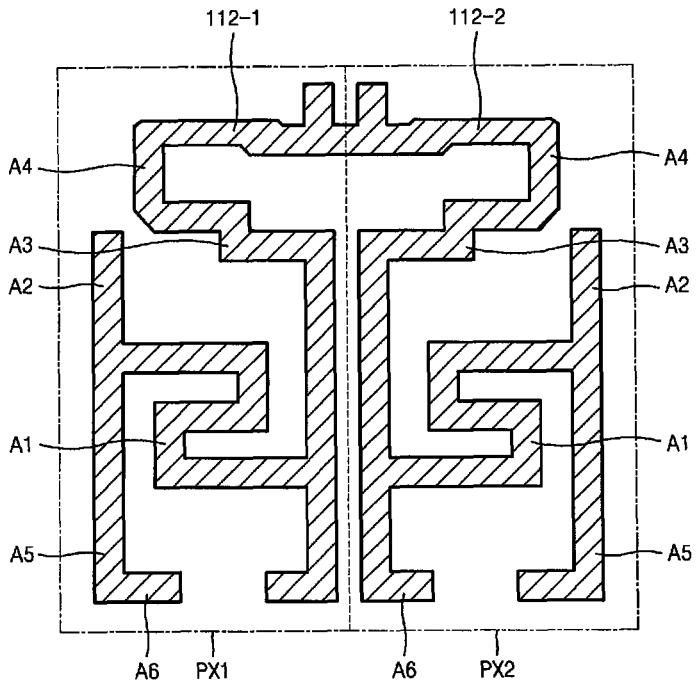
FIGS. 5 through 10 are views for explaining a method for forming two adjacent pixels according to an embodiment of the present invention.
Figure 6:
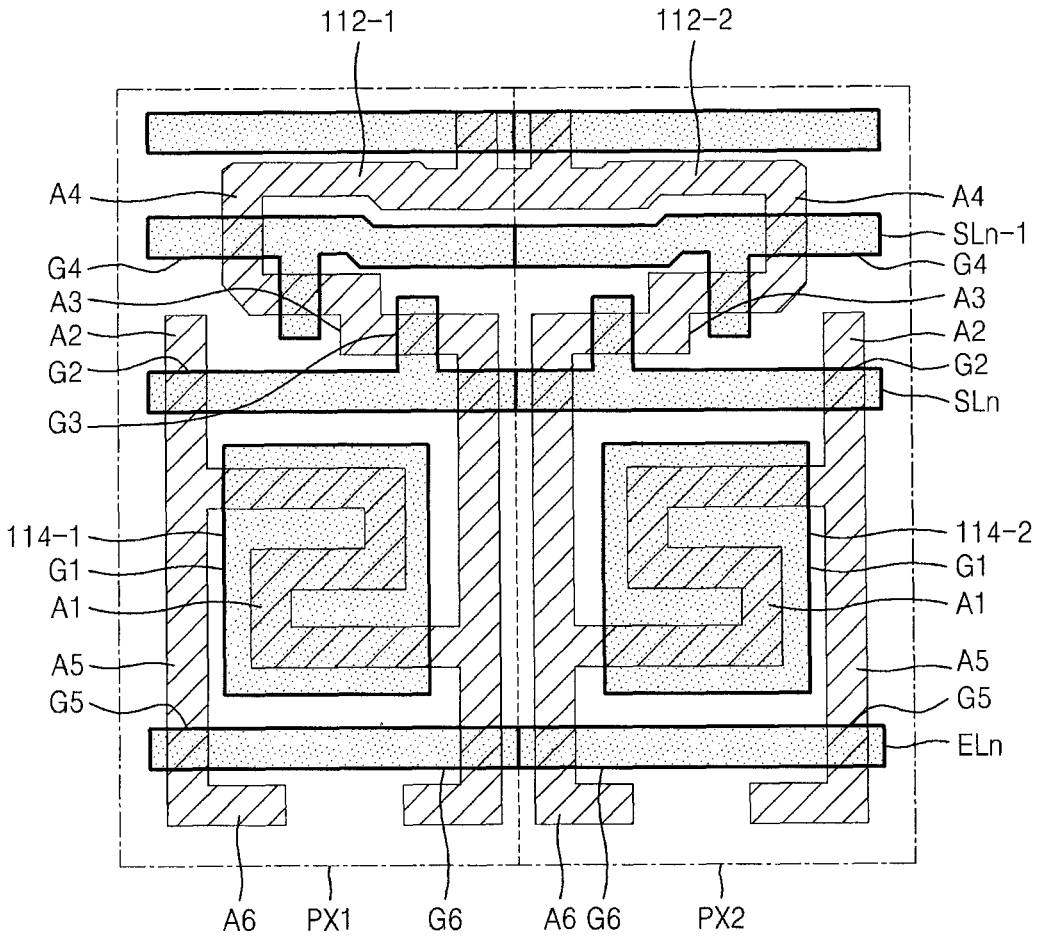

FIG. 4 is a view for explaining a mesh structure of driving voltage lines PL of a display apparatus according to an embodiment of the present invention. Referring to FIG. 4, according to an embodiment of the present invention, a plurality of driving voltage lines PL of the display apparatus includes a vertical driving voltage line PLV that extends in a vertical direction for each column line, and a horizontal driving voltage line PLH that couples corresponding adjacent pixels along a row line (e.g., PX1 and PX2, or PX3 and PX4), thus forming a mesh structure. In the present embodiment, the horizontal driving voltage line PLH is formed of the connection wiring 120 that couples two corresponding vertical driving voltage lines PLV. The connection wiring 120 may be formed as a single unit with a wiring extended from the vertical driving voltage PLV or may be a separate wiring.

The horizontal driving voltage line PLH is arranged according to an arrangement of elements of a pixel circuit. The vertical driving voltage lines PLV of two pixels that share a horizontal driving voltage line PLH (e.g., of the first and second pixels PX1 and PX2) may be separated from each other by a relatively long distance, and may face each other. On the other hand, the vertical driving voltage lines PLV of two adjacent pixels that do not share a horizontal driving voltage line PLH (e.g., the second and third pixels PX2 and PX3) are adjacent each other and face each other. No horizontal driving voltage line PLH is formed between two adjacent pixels that do not share the horizontal driving voltage line PLH (for example, between the second pixel PX2 and the third pixel PX3).

FIGS. 5 through 10 are views for explaining a method for forming two adjacent pixels according to an embodiment of the present invention. FIG. 11 is a cross-sectional view of the two adjacent pixels cut along the line A-A' of FIG. 9. Referring to FIGS. 5 through 11, according to an embodiment of the present invention, active layers 112-1 and 112-2 of the first pixel PX1 and the second pixel PX2 are formed on a substrate 101. In the present embodiment, the first active layer 112-1 of the first pixel PX1 and the second active layer 112-2 of the second pixel PX2 are coupled to each other. The first active layer 112-1 and the second active layer 112-2 have symmetrical structures with respect to a portion coupling the first pixel PX1 and the second pixel PX2 (e.g., with respect to a vertical line passing through a portion coupling the first pixel PX1 and the second pixel PX2). An active area of the portion coupling the first pixel PX1 and the second PX2 is later coupled to an initialization voltage line VL.

The first active layer 112-1 and the second active layer 112-2 may be formed of, for example, an amorphous silicon layer, a polycrystalline silicon layer, or an oxide semiconductor layer such as a G-I—Z—O layer [$(In_2O_3)a(Ga_2O_3)b(ZnO)c$ layer] (each of a, b, and c is a real number that satisfies the condition of $a \geq 0$, $b \geq 0$, $c > 0$). According to the present embodiment, the first active layer 112-1 and the second active layer 112-2 are coupled to each other, and thus, an initialization voltage VINT applied through the initialization voltage line VL may be transferred to the first pixel PX1 and the second pixel PX2.

A TFT of a pixel circuit 2 is formed along the first active layer 112-1 and the second active layer 112-2. Active layers A1, A2, A3, A4, A5, and A6, which are respectively of a driving TFT T1, a switching TFT T2, a compensation TFT T3, an initialization TFT T4, a first emission control TFT T5, and a second emission control TFT T6, are formed at each of the first active layer 112-1 and the second active layer 112-2. An active layer of each TFT includes a channel region that is not doped with an impurity, and a source region and a drain region that are formed on respective sides of the channel region, and which are doped with impurities. The impurities may vary according to a type of the TFT, and may be an N-type or P-type impurity.

In the present embodiment, the first active layer 112-1 and the second active layer 112-2 may be curved in various manners. For example, the active layer A1 of the driving TFT T1 may have a curved portion that has a zigzag form, an 'S' shape, or a '≡' form. Accordingly, a relatively long channel region may be formed, thereby increasing a driving range of a gate voltage. Thus, as the driving range of the gate voltage is broadened, gradation of the light emitted from an OLED may be adjusted precisely by varying amplitude of the gate voltage. Consequently, a resolution of the organic light emitting display apparatus may be increased, and a display quality may be improved.

Referring to FIGS. 6 through 11, according to the present embodiment, a first gate insulation layer GI1 is formed on the substrate 101 on which the first active layer 112-1 and the second active layer 112-2 are formed (see FIG. 11). The first gate insulation layer GI1 may have a multi-layer structure in which an organic insulation material and an inorganic insulation material, or an organic insulation material and an inorganic insulation material, are alternatingly stacked.

In the present embodiment, a first gate wiring GL1 is formed on the first gate insulation layer GI1. The first gate wiring GL1 may include a first scanning line SLn, a second scanning line SLn-1, an emission control line ELn, and two first capacitor electrodes 114-1 and 114-2. The first gate wiring GL1 may include a low-resistance metal such as, for example, aluminum (Al) or copper (Cu).

The first capacitor electrodes 114-1 and 114-2 also function as the gate electrode G1 of the driving TFT T1. The two first capacitor electrodes 114-1 and 114-2 are separated from each other, and are symmetrical in structure with respect to a vertical line passing through a portion coupling the first pixel PX1 and the second pixel PX2. The two first capacitor electrodes 114-1 and 114-2 are in the first pixel PX1 and the second pixel PX2, respectively.

In the present embodiment, the first capacitor electrodes 114-1 and 114-2 are separated from the first scanning line SLn, the second scanning line SLn-1, and the emission control line ELn, and overlap a channel region of an active layer A1 of the driving TFT T1 in the form of a floating electrode. The first capacitor electrodes 114-1 and 114-2 are separated from adjacent pixels, and are substantially square or rectangular. The first scanning line SLn functions as the gate electrode G2 of the switching TFT T2, and as the gate electrode G3 of the compensation TFT T3. The second scanning line SLn-1 functions as the gate electrode G4 of the initialization TFT T4. The emission control line ELn functions as the gate electrode G5 of the first emission control TFT T5, and also as the gate electrode G6 of the second emission control TFT T6.

Figure 7:
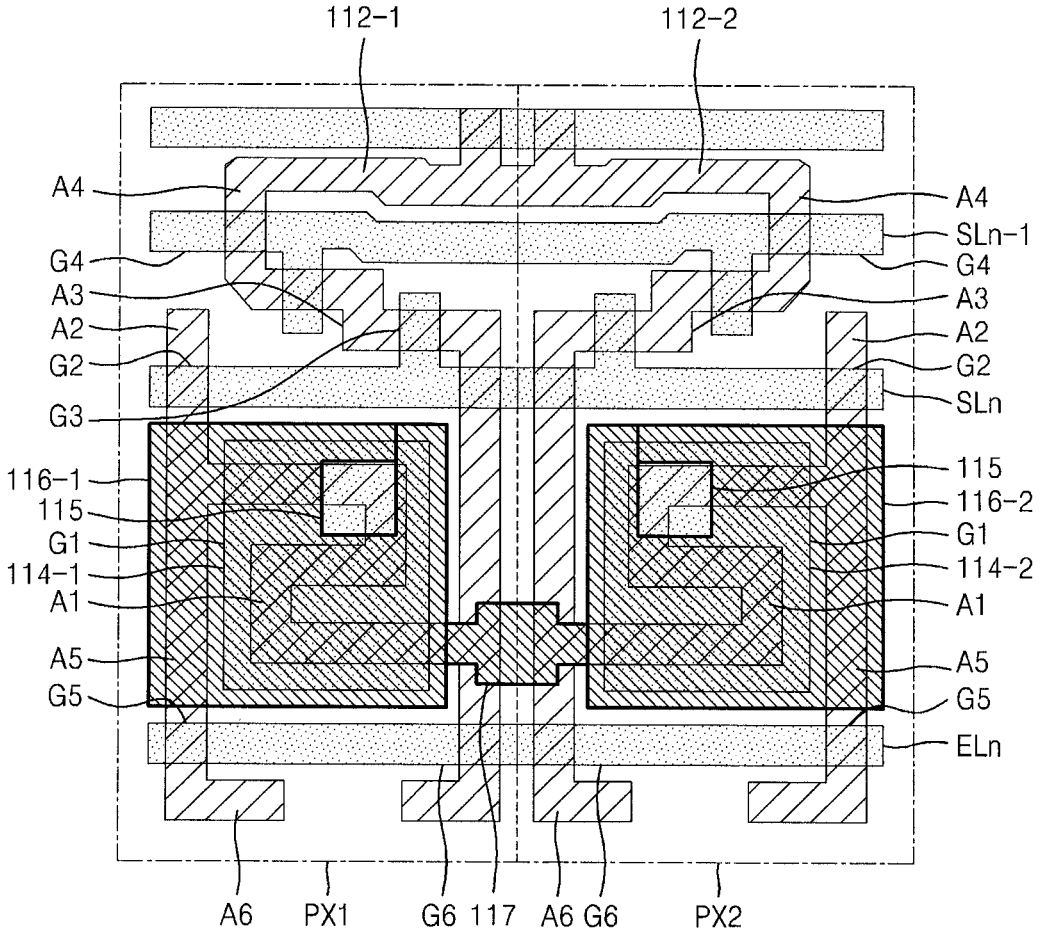

Referring to FIGS. 7 and 11, according to the present embodiment, a second gate insulation layer GI2 is formed on the substrate 101 on which the first gate wiring GL1 is formed (see FIG. 11). The second gate insulation layer GI2 functions also as a dielectric body of the first storage capacitors Cst1. The second gate insulation layer GI2 may have a multi-layered structure in which an organic insulation material and an inorganic insulation material, or an organic insulation material and an inorganic insulation material, are alternatingly formed.

According to the present embodiment, a second gate wiring GL2 is formed on the second gate insulation layer GI2. The second gate wiring GL2 may include two second capacitor electrodes 116-1 and 116-2. Similar to the first gate wiring GL1, the second gate wiring GL2 may also preferably include a low-resistance metal such as aluminum (Al) or copper (Cu).

In the present embodiment, the second capacitor electrodes 116-1 and 116-2 respectively overlap the first capacitor electrodes 114-1 and 114-2 to collectively form first storage capacitors Cst1. The second capacitor electrodes 116-1 and 116-2 are structurally symmetrical with respect to a vertical line passing through the portion coupling the first pixel PX1 and the second pixel PX2. The two second capacitor electrodes 116-1 and 116-2 are in the first pixel PX1 and the second pixel PX2, respectively. The second capacitor electrodes 116-1 and 116-2 are coupled to each other via a bridge 117, which couples the second capacitor electrodes 116-1 and 116-2 by a relatively small distance. The bridge 117 may be positioned or formed to overlap the horizontal driving voltage line PLH of FIG. 4, which will be described later.

According to the present embodiment, the second capacitor electrodes 116-1 and 116-2 each include a first storage opening portion 115. The first storage opening portion 115 may be a closed curve. Here, a closed curve refers to a closed figure whose starting point and ending point are identical, like, for example, a polygon or a circle. The second capacitor electrodes 116-1 and 116-2 including the first storage opening portions 115 may have a donut shape. Due to the shape of the second capacitor electrodes 116-1 and 116-2, even if there is an overlay deviation or variation between the first capacitor electrodes 114-1 and 114-2 and the second capacitor electrodes 116-1 and 116-2 during the manufacturing process of the display apparatus, the storage capacitor Cst may constantly have a substantially uniform capacitance. When forming at least two overlapping layers, and when the layers are shifted in a vertical or a horizontal direction, an overlapped portion of the layers differs from an initially designed overlapped portion. The difference in the overlapped portion may be referred to as the overlay deviation, which may occur due to misalignment between a substrate and a mask, or due to misalignment between a substrate and an exposure device when a conductive layer is being formed on the surface of the substrate, and the conductive layer is patterned by undergoing a photolithography process. The overlay deviation may be generated in a system in which relatively large-sized panels are produced in relatively large amounts within an error range of the processing equipment. According to present embodiment, even when the first capacitor electrodes 114-1 and 114-2 are shifted in a vertical or horizontal direction from a position at which the first capacitor electrodes 114-1 and 114-2 are designed to be formed, the second capacitor electrodes 116-1 and 116-2 are configured to respectively overlap the first capacitor electrodes 114-1 and 114-2, and the first storage opening portions 115 of the second capacitor electrodes 116-1 and 116-2 are each configured to respectively overlap the first capacitor electrodes 114-1 and 114-2. Thus, a substantially uniform capacitance may be maintained.

Figure 8:
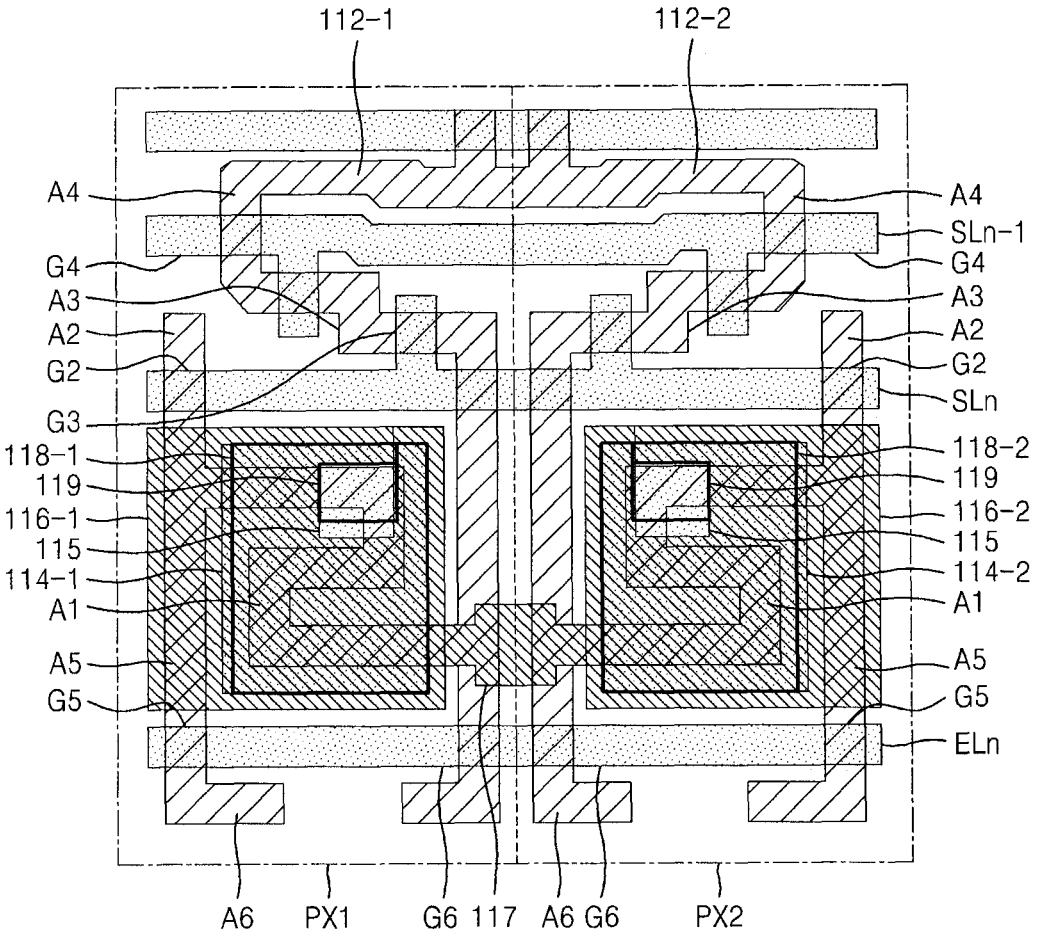

Referring to FIGS. 8 and 11, according to the present embodiment, a third gate insulation layer GI3 is formed on the substrate 101, on which the second gate wiring GL2 is formed. Like the first gate insulation layer GI1 and the second gate insulation layer GI2, the third gate insulation layer GI3 may have a multi-layer structure in which an organic insulation material and an inorganic insulation material, or an organic insulation material and an inorganic insulation material, are alternatingly stacked.

In the present embodiment, a third gate wiring GL3 is formed on the third gate insulation layer GI3. The third gate wiring GL3 may include two third capacitor electrodes 118-1 and 118-2. Like the first gate wiring GL1 and the second gate wiring GL2, the third gate wiring GL3 may also include a low-resistance metal such as, for example, aluminum (Al) or copper (Cu).

The third capacitor electrodes 118-1 and 118-2 overlap the second capacitor electrodes 116-1 and 116-2 to form a second storage capacitor Cst2. The third capacitor electrodes 118-1 and 118-2 are separated from each other, and are symmetrical with respect to vertical line through a portion coupling the first pixel PX1 and the second pixel PX2. The two third capacitor electrodes 118-1 and 118-2 may be formed in the first pixel PX1 and the second pixel PX2, respectively. The third capacitor electrodes 118-1 and 118-2 do not overlap with the bridge 117 that couples the second capacitor electrodes 116-1 and 116-2.

In the present embodiment, the third capacitor electrodes 118-1 and 118-2 include a second storage opening portion 119. The second storage opening portion 119 may be, for example, in the form of a closed curve, and may be coupled to the first storage opening portion 115. Accordingly, the first capacitor electrodes 114-1 and 114-2 are exposed via the second storage opening portion 119 and the first storage opening portion 115.

Figure 9:
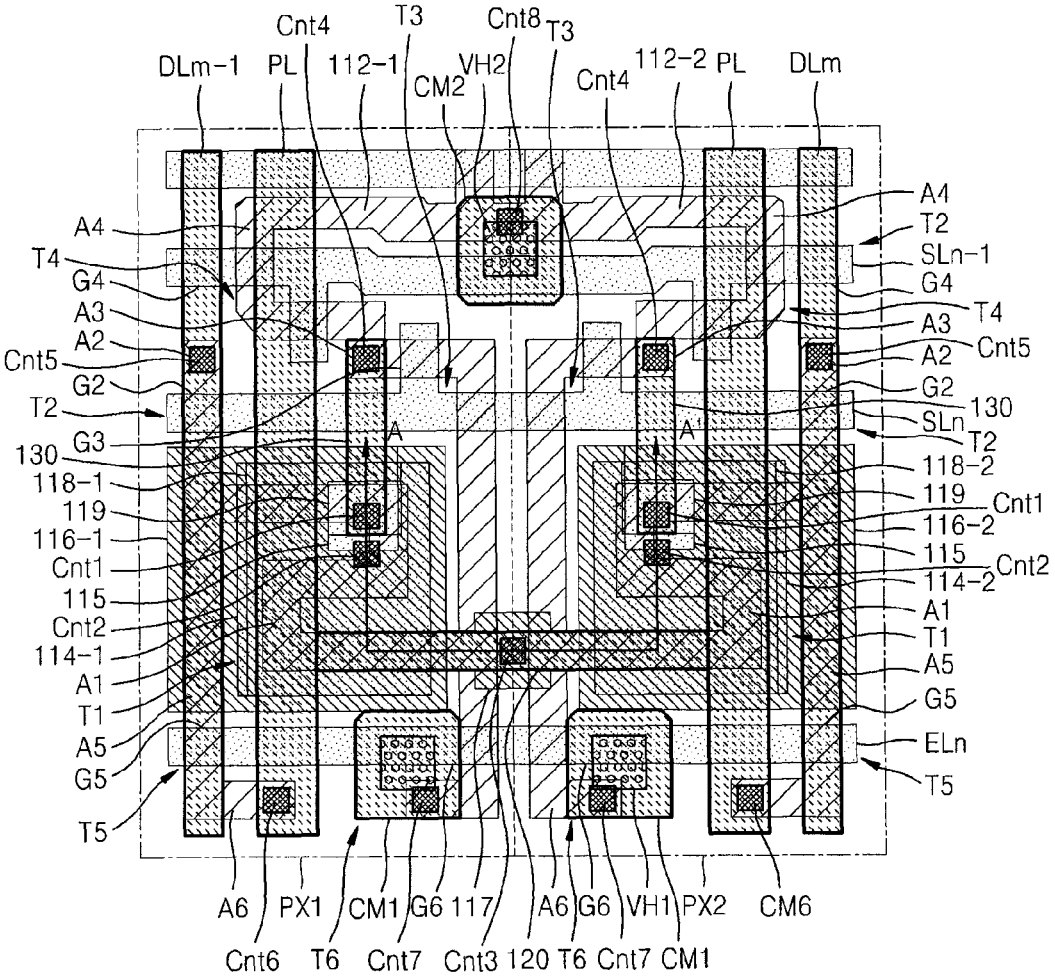

Referring to FIGS. 9 and 11, according to the present embodiment, an interlayer insulation layer ILD is formed on/above the substrate 101 on which the second gate wiring GL2 is formed. Like the first, second, and third gate insulation layers GI1, GI2, and GI3, the interlayer insulation layer ILD may have a multi-layer structure in which an organic insulation material and an inorganic insulation material, or an organic insulation material and an inorganic insulation material, are alternatingly stacked.

In the present embodiment, a first contact hole Cnt1 is formed in the second gate insulation layer GI2, in the third gate insulation layer GI3, and in the interlayer insulation layer ILD by passing through the second storage opening portion 119 of the third capacitor electrodes 118-1 and 118-2 and through the first storage opening portion 115 of the second capacitor electrodes 116-1 and 116-2 to expose the first capacitor electrodes 114-1 and 114-2. A second contact hole Cnt2 is formed in the interlayer insulation layer ILD to expose the third capacitor electrodes 118-1 and 118-2. The first contact hole Cnt1 and the second contact hole Cnt2 may be located adjacent each other. The first contact hole Cnt1 and the second contact hole Cnt2 are formed both in the first pixel PX1 and the second pixel PX2.

In the present embodiment, a third contact hole Cnt3 is formed in the third gate insulation layer GI3 and in the interlayer insulation layer ILD to expose a portion of the bridge 117 that couples the two second capacitor electrodes 116-1 and 116-2.

In the present embodiment, a fourth contact hole Cnt4 is formed in the first, second, and third gate insulation layers GI1, GI2, and GI3, and in the interlayer insulation layer ILD to expose a drain region of the active layer A3 of the compensation TFT T3 and to expose the active layer A4 of the initialization TFT T4. A fifth contact hole Cnt5 is formed in the first, second, and third gate insulation layers GI1, GI2, and GI3, and in the interlayer insulation layer ILD to expose a source region of the active layer A2 of the switching TFT T2. In the present embodiment, a sixth contact hole Cnt6 is formed in the first, second, and third gate insulation layers GI1, GI2, and GI3, and in the interlayer insulation layer ILD to expose the active layer A5 of the first emission control TFT T5. A seventh contact hole Cnt7 is formed in the first, second, and third gate insulation layers GI1, GI2, and GI3, and in the interlayer insulation layer ILD to expose the active layer A6 of the second emission control TFT T6. An eighth contact hole Cnt8 is formed in the first, second, and third gate insulation layers GI1, GI2, and GI3, and in the interlayer insulation layer ILD to expose a portion that couples the first active layer 112-1 of the first pixel PX1 and the second active layer 112-2 of the second pixel PX2.

According to the present embodiment, the data line DLm-1 or DLm, the driving voltage line PL in a vertical direction, a connecting wiring 120 formed in a horizontal direction, a contact node 130 that couples the first contact hole Cnt1 and the second contact hole Cnt2 are formed on the interlayer insulation layer ILD. Further, a first cover metal CM1 covers the seventh contact hole Cnt7, and a second cover metal CM2 covers the eighth contact hole Cnt8, the first and second cover metals CM1 and CM2 being formed on the interlayer insulation layer ILD.

The data line DLm-1 or DLm may be located for each pixel at an outer portion of the pixel in a vertical direction. The data line DLm-1 or DLm may be coupled to the switching TFT T2 via the fifth contact hole Cnt5.

According to the present embodiment, the driving voltage line PL includes a driving voltage line PL in a vertical direction and a connection wiring 120, which is a driving voltage line in a horizontal direction. The driving voltage line PL in a vertical direction for each pixel is adjacent a respective data line DLm-1 or DLm. Two driving voltage lines PL in a vertical direction face each other, with the first pixel PX1 and the second pixel PX2 included therebetween. A driving voltage line PL in a horizontal direction crosses the first pixel PX1 and the second pixel PX2 in a horizontal direction, and couples the vertical driving voltage lines PL of the first pixel PX1 and the second pixel PX2. Accordingly, the driving voltage lines PL are in a mesh structure configuration. The connection wiring 120, which is a driving voltage line PL in a horizontal direction, may be coupled to the bridge 117 through the third contact hole Cnt3, and accordingly, the connection wiring 120 can transfer a voltage to the two second capacitor electrodes 116-1 and 116-2.

In the present embodiment, the contact node 130 respectively couples the first capacitor electrodes 114-1 and 114-2 and the third capacitor electrodes 118-1 and 118-2. Accordingly, respective ones of the first capacitor electrodes 114-1 and 114-2 and the third capacitor electrodes 118-1 and 118-2 have the same potential, and the first storage capacitor Cst1 and the second storage capacitor Cst2 have a parallel connection arrangement. The contact node 130 couples the first capacitor electrodes 114-1 and 114-2, the compensation TFT T3, and the initialization TFT T4.

In the present embodiment, the data lines DLm-1 and DLm, the driving voltage line PL including the connection wiring 120, the contact node 130, the first cover metal CM1, and the second cover metal CM2 may be formed on the same layer and of the same material.

In the present embodiment, a protection layer PVL is formed on/above the substrate 101 on/above which the data lines DLm-1 and DLm, the driving voltage line PL including the connection wiring 120, the contact node 130, the first cover metal CM1, and the second cover metal CM2 are formed. In the protection layer PVL, there are a first via hole(s) VH1 and a second via hole VH2 that respectively expose a portion of the first cover metal CM1 and a portion of the second cover metal CM2 (see FIG. 10). The first via hole(s) VH1 and the second via hole VH2 (e.g., the material filling the first and second via holes VH1 and VH2) may be formed of the same material.

By forming a common second via hole VH2 for two adjacent pixels (e.g., the first and second pixels PX1 and PX2), an aperture ratio of pixels may be improved when compared to forming a second via hole VH2 for each pixel.

Figure 10:
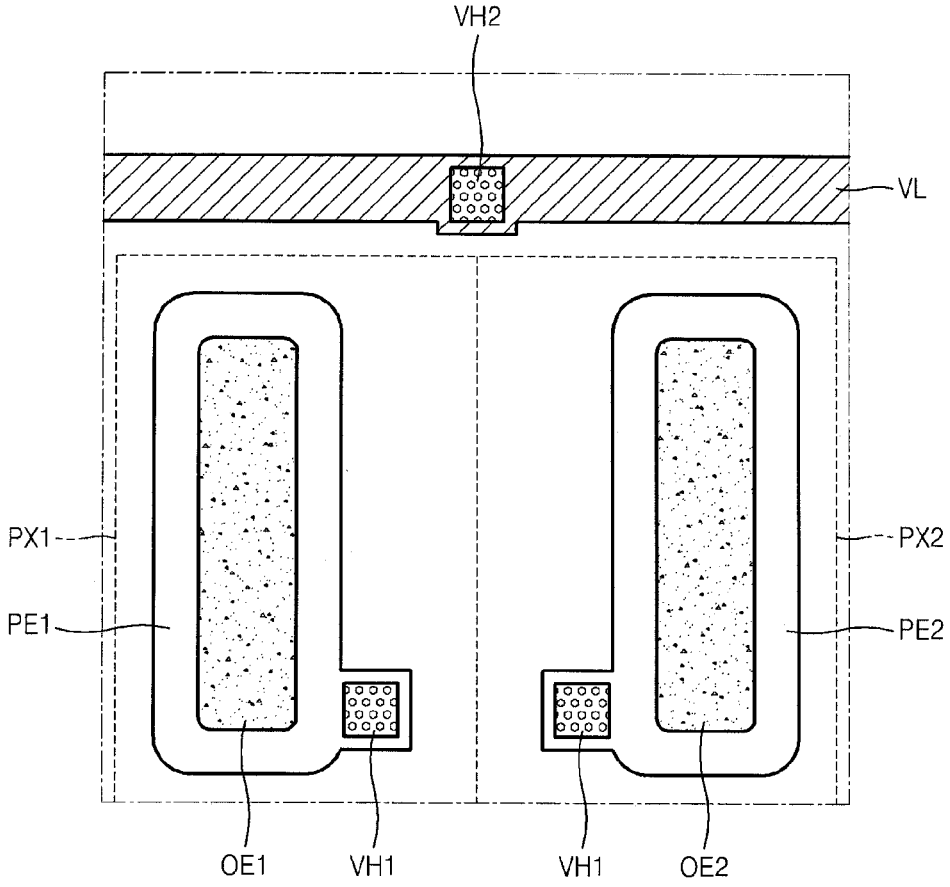
Figure 11:
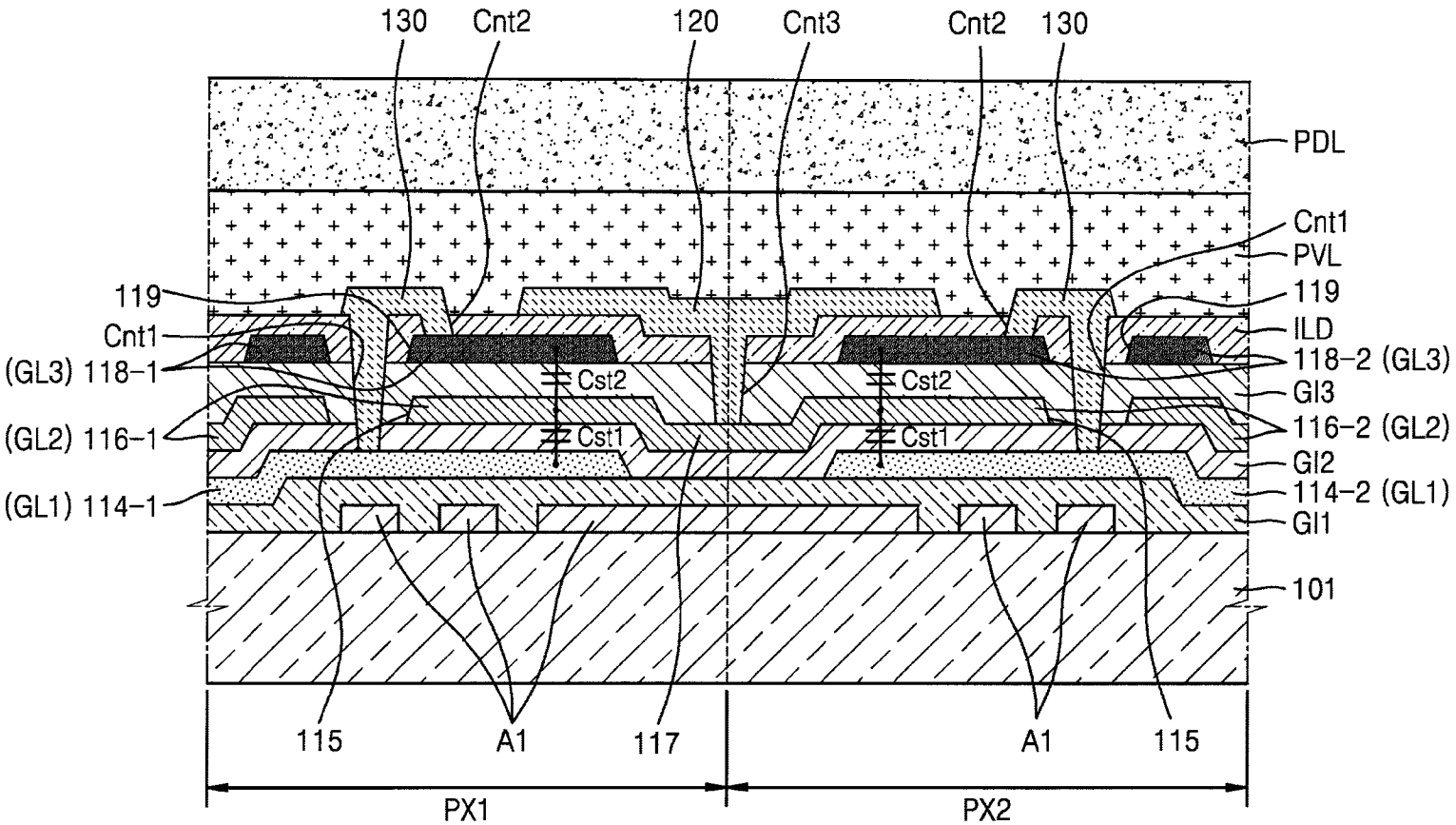
FIG. 11 is a cross-sectional view of two pixels cut along the line A-A' of FIG. 9.

Referring to FIG. 10, according to the present embodiment, pixel electrodes PE1 and PE2, and an initialization voltage line VL are formed on the protection layer PVL. The pixel electrodes PE1 and PE2 are coupled to the second emission control TFT T6 via the first via hole VH1. The initialization voltage line VL is coupled to the initialization TFT T4 of the first pixel PX1 and of the second pixel PX2 via the second via hole VH2, thereby being able to transfer the initialization voltage VINT to the first pixel PX1 and the second pixel PX2 at the same time. The initialization voltage line VL may be formed on the same layer and of the same material as the pixel electrodes PE1 and PE2.

In the present embodiment, a pixel define layer PDL is formed at a boundary of the pixel electrodes PE1 and PE2, and on the protection layer PVL. The pixel define layer PDL may have a pixel opening portion that exposes the pixel electrodes PE1 and PE2. The pixel define layer PDL may be formed of an organic material such as, for example, a polyacrylate resin or a polyimide, or of an inorganic material such as a silica-based material. In the present embodiment, organic layers OE1 and OE2 and an opposite electrode (which covers the organic layers OE1 and OE2 and is formed on/over the entire surface of a substrate), are formed on the pixel electrodes PE1 and PE2 that are exposed via the pixel opening portion. Consequently, an OLED of each of the first pixel PX1 and the second pixel PX2, which respectively include the pixel electrodes PE1 and PE2, the organic layers OE1 and OE2 on the pixel electrodes PE1 and PE2, and a corresponding opposite electrode, are formed.

When the display apparatus is a top emission display apparatus, the pixel electrodes PE1 and PE2 are reflective electrodes, and the opposite electrode is a light-transmissive electrode. Accordingly, the opposite electrode may include a semi-transmissive reflective layer formed of, for example, Ag, Mg, Al, Pt, Pd, Au, Ni, Nd, Ir, Cr, Li, Ca or the like, in the form of a thin film, or may include a light-transmissive metal oxide such as ITO, IZO, or ZnO.

When the display apparatus is a bottom emission display apparatus, the opposite electrode may be formed to have a reflecting function by depositing, for example, Ag, Mg, Al, Pt, Pd, Au, Ni, Nd, Ir, Cr, Li, Ca or the like. When using the pixel electrodes PE1 and PE2 as an anode electrode, a layer formed of a metal oxide having a relatively high work function (absolute value) such as, for example, ITO, IZO, or ZnO is included. Also, the opposite electrode is formed of a cathode electrode.

When the pixel electrodes PE1 and PE2 are used as cathode electrodes, a relatively high-conductivity metal having a low work function (absolute value) such as, for example, Ag, Mg, Al, Pt, Pd, Au, Ni, Nd, Ir, Cr, Li, Ca or the like is used, and the opposite electrode is formed as an anode electrode.

The organic layers OE1 and OE2 of the first pixel PX1 and the second pixel PX2 may be formed in a single-layer structure or a multi-layer structure in which at least one of functional layers such as, for example, an emissive layer (EML), a hole transport layer (HTL), a hole injection layer (HIL), an electron transport layer (ETL), and an electron injection layer (EIL), is stacked. The organic layers OE1 and OE2 may be formed of a low-molecular material, or of a polymer organic material. When light of a red, green, or blue color is emitted from the organic layers OE1 and OE2, the emissive layer may be patterned to a red emissive layer, a green emissive layer, and a blue emissive layer; according to a red sub-pixel, a green sub-pixel, and a blue sub-pixel, respectively.

According to the above-described embodiments of the present invention, an organic emissive layer is formed in each of the pixels. Accordingly, red, green, and blue color light is emitted from each pixel, and a pixel group emitting red, green, and blue color light may form a single unit pixel. However, the embodiments of the present invention are not limited thereto, and an organic emissive layer may be commonly formed for the entire pixel. For example, a plurality of organic emissive layers that emit red, green, and blue light may be stacked vertically, or may be mixed so as to emit white light. However, a combination of colors for emitting white light is not limited thereto. For example, a color conversion layer or a color filter that converts the emitted white light to another predetermined or set color may be additionally included.

Figure 12:
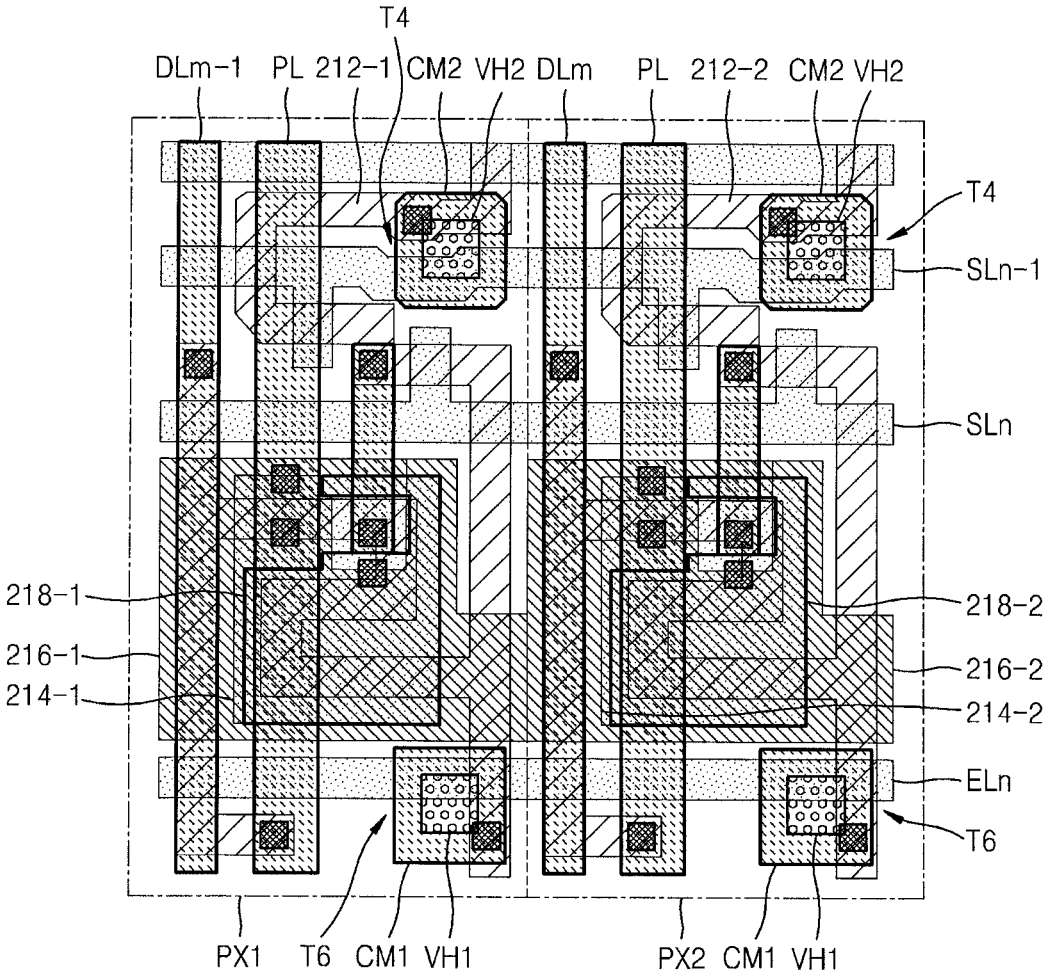
FIGS. 12 and 13 are views of two pixels for explaining a comparative example.
Figure 13:
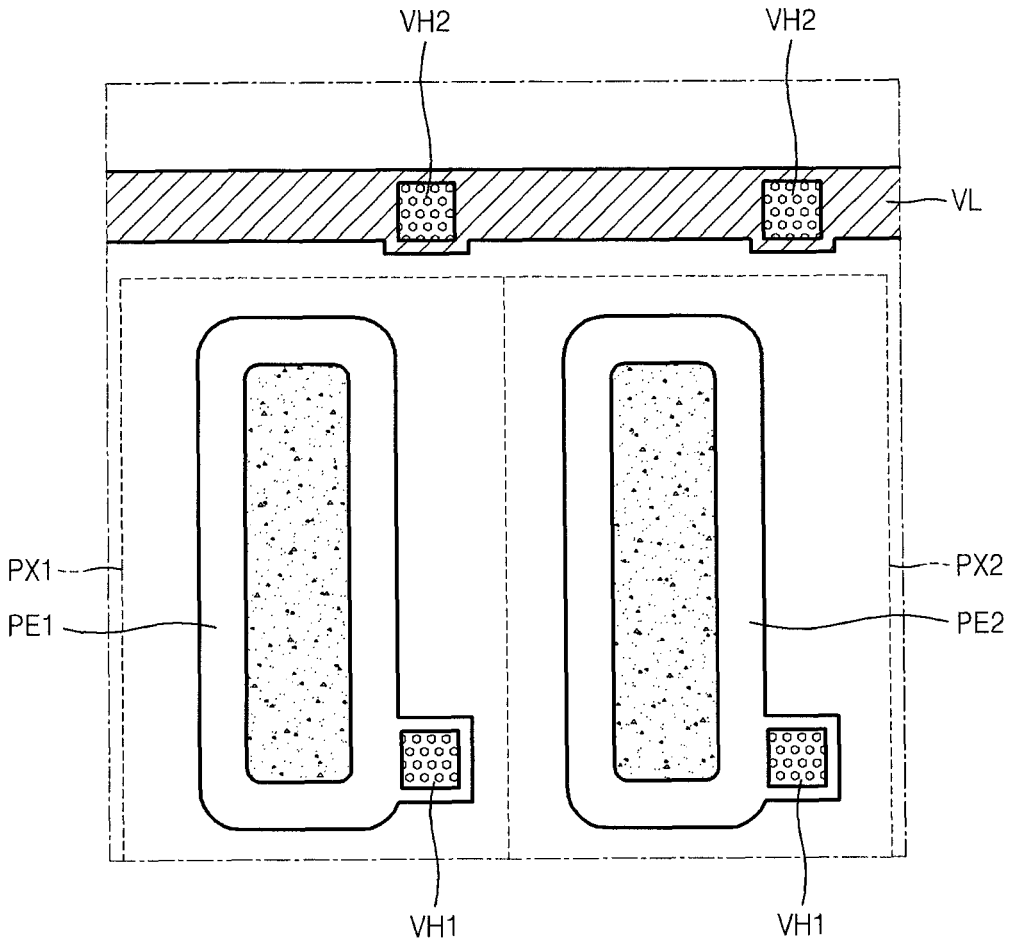

FIGS. 12 and 13 are schematic views for explaining a comparative example of pixels.

According to the comparative example, an active layer 212-1 of a first pixel PX1 and an active layer 212-2 of a second pixel PX2 are separately formed on a substrate 101. A first gate insulation layer, a first gate wiring, a second gate insulation layer, a second gate wiring, a third gate insulation layer, a third gate wiring, and an interlayer insulation layer are sequentially formed on the active layers 212-1 and 212-2.

The first gate wiring may include a first scanning line SLn, a second scanning line SLn-1, an emission control line ELn, and first capacitor electrodes 214-1 and 214-2. The second gate wiring may include second capacitor electrodes 216-1 and 216-2. The third gate wiring may include third capacitor electrodes 218-1 and 218-2. The second capacitor electrode 216-1 of the first pixel PX1 and the second capacitor electrode 216-2 of the second pixel PX2 are coupled to each other.

A data line DL and a driving voltage line PL are formed on the interlayer insulation layer. The driving voltage line PL extends in a vertical direction. The second capacitor electrode 216-1 of the first pixel PX1, and the second capacitor electrode 216-2 of the second pixel PX2, are coupled to the driving voltage line PL via a contact hole, so that the second capacitor electrodes 216-1 and 216-2 form a mesh structure of the driving voltage lines PL. To couple the second capacitor electrodes 216-1 and 216-2 to the driving voltage line PL, the third capacitor electrodes 218-1 and 218-2 between the second capacitor electrodes 216-1 and 216-2 and the driving voltage line PL have a hollow portion corresponding to the contact hole. Further, a first cover metal CM1 and a second cover metal CM2 are formed on the interlayer insulation layer.

A protection layer is formed on the substrate on which the data lines DLm-1 and DLm, the driving voltage line PL, the first cover metal CM1, and the second cover metal CM2 are formed. A first via hole VH1 and a second via hole VH2 that respectively expose a portion of the first cover metal CM1 and the second cover metal CM2 are formed in the protection layer of the first pixel PX1 and the second pixel PX2, respectively.

Pixel electrodes PE1 and PE2 and an initialization voltage line VL are formed on the protection layer. Each of the pixel electrodes PE1 and PE2 is respectively coupled to the second emission control TFTs T6 of the first and second pixel PX1 and PX2 via the first via holes VH1. An initialization voltage line VL is coupled to the initialization TFT T4 of each of the first pixel PX1 and the second pixel PX2 via the second via holes VH2 of the first pixel PX1 and of the second pixel PX2, thereby enabling the transfer of an initialization voltage VINT to the first pixel PX1 and the second pixel PX2.

Figure 14:
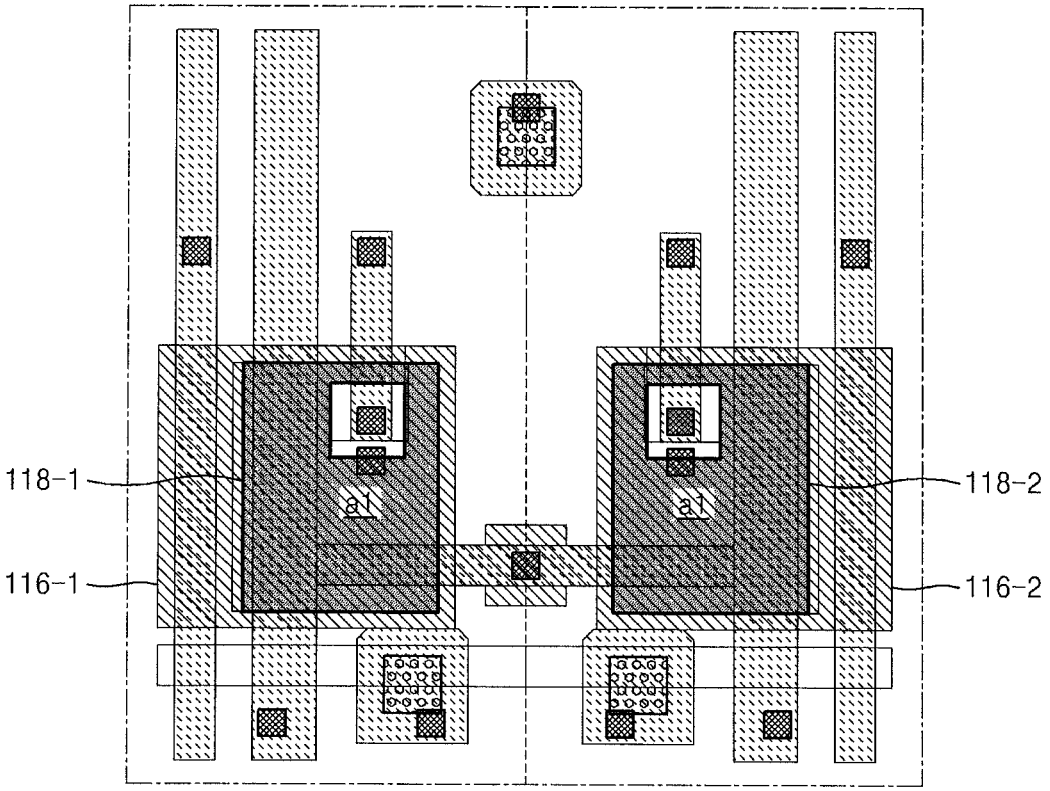
FIG. 14 is a schematic view of a surface area a1 of a second storage capacitor of FIG. 9 according to an embodiment of the present invention.
Figure 15:
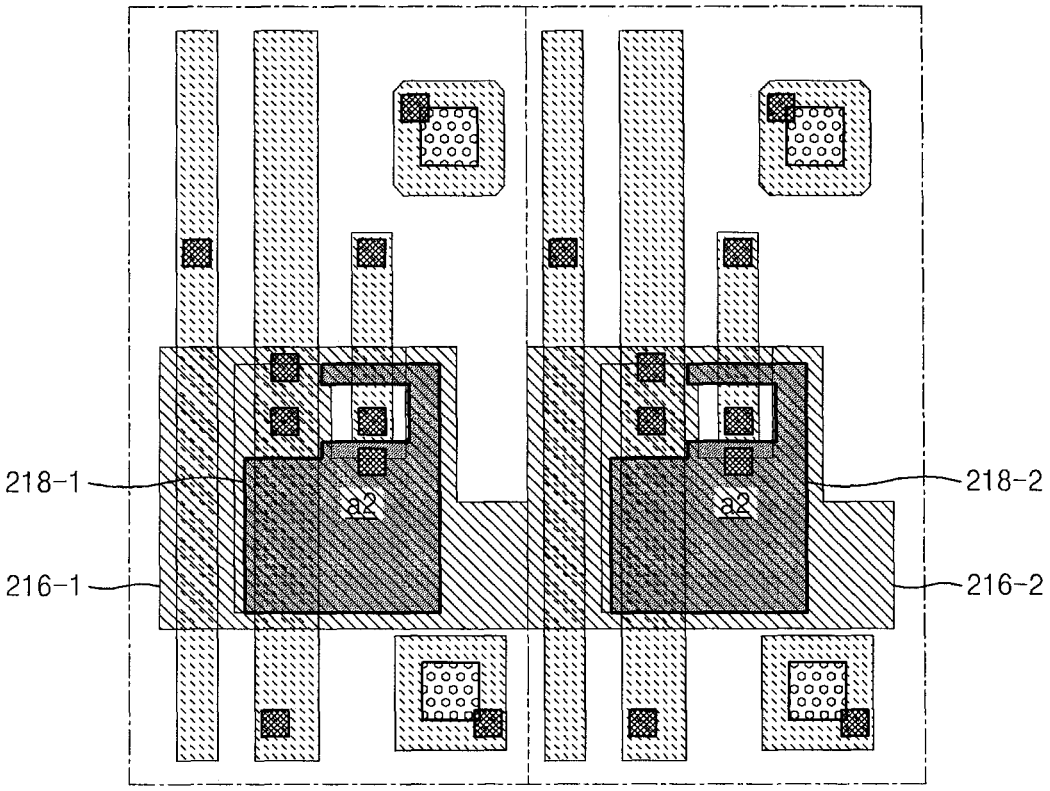
FIG. 15 is a schematic view of a surface area a2 of a second storage capacitor of FIG. 12 according to the comparative example.

FIG. 14 is a schematic view of a surface area a1 of the second storage capacitor Cst2 of FIG. 9 according to an embodiment of the present invention, and FIG. 15 is a schematic view of a surface area a2 of a second storage capacitor of FIG. 12 according to the comparative example.

According to an embodiment of the present invention, as illustrated in FIG. 14, a driving voltage line PL having a mesh structure is included, and the two second capacitor electrodes 116-1 and 116-2 receive a voltage via the connection wiring 120, which is a horizontal driving voltage line, through a third contact hole Cnt3 (see FIG. 9). Also, the third contact hole Cnt3 corresponds to the bridge 117 that couples the two second capacitor electrodes 116-1 and 116-2. Accordingly, the third contact hole Cnt3, which is included for connecting the driving voltage line PL and the second capacitor electrodes 116-1 and 116-2, is formed in a portion that does not correspond to the third capacitor electrodes 118-1 and 118-2. As a result, there is substantially no loss in a portion where the second capacitor electrodes 116-1 and 116-2 and the third capacitor electrodes 118-1 and 118-2 overlap with each other due to the third contact hole Cnt3. Thus, the second storage capacitor Cst2 that has a comparatively larger capacity may be configured.

On the other hand, according to the comparative example of FIG. 15, the driving voltage line PL extends in a vertical direction. Accordingly, a contact hole is utilized to couple the second capacitor electrodes 216-1 and 216-2 and the driving voltage line PL at a position corresponding to a portion of the second capacitor electrodes 216-1 and 216-2 in each pixel. Accordingly, a portion of the third capacitor electrodes 218-1 and 218-2 that overlaps with the second capacitor electrodes 216-1 and 216-2 is removed. Consequently, in the embodiment illustrated in FIG. 14, capacitance of the second storage capacitor Cst2 is greater than that of the second storage capacitor of the comparative example of FIG. 15. Experiments showed that the surface area a1 of the storage capacitor Cst2 according to the embodiments of the present invention increases by up to 38% or more compared to the surface area a2 of the second storage capacitor of the comparative example of FIG. 15.

According to the above-described embodiments of the present invention, an active matrix (AM) type organic light emitting display apparatus having a 6Tr-2Cap structure including six TFTs and two capacitors in each pixel is illustrated. However, the embodiments of the present invention are not limited thereto. Thus, a display apparatus may have various structures. For example, a display apparatus may include a plurality of TFTs and at least one capacitor in each pixel, and additional wirings may be further formed or conventional wirings may be omitted.

According to the embodiments of the present invention, a first pixel and a second pixel that are adjacent each other in a row direction are symmetrical with respect to a portion coupling the first pixel and the second pixel, and a voltage is commonly applied to capacitor devices in the two pixels. The capacitance may be increased without reducing a surface area of a portion where the two electrodes of the capacitor are overlapped.

While aspects of embodiments of the present invention has been particularly shown and described with reference to example embodiments thereof, it will be understood by those having ordinary skill in the art that various changes in form and details may be made therein without departing from the spirit and scope of the embodiments present invention as defined by the following claims, and their equivalents.

What is claimed is:

[1. An organic light emitting display apparatus comprising:

two pixels symmetrical to each other, located on a substrate, and adjacent each other in a first direction, each of the pixels comprising a pixel circuit and an organic light emitting diode (OLED);

two top capacitor electrodes separated from each other and symmetrical to each other, each of the top capacitor electrodes being respectively located in one of the pixel circuits;

two intermediate capacitor electrodes symmetrical to each other and insulated from, and overlapping with, the top capacitor electrodes;

a bridge coupling the intermediate capacitor electrodes without overlapping the top capacitor electrodes; and a driving voltage line coupled to the bridge, and configured to apply a common voltage to the intermediate capacitor electrodes.]

[2. The organic light emitting display apparatus of claim 1, wherein an entirety of each of the top capacitor electrodes overlaps with a respective one of the intermediate capacitor electrodes.]

[3. The organic light emitting display apparatus of claim 1, further comprising two bottom capacitor electrodes symmetrical to each other and located below the intermediate capacitor electrodes, the bottom capacitor electrodes being insulated from, and overlapping with, the intermediate capacitor electrodes.]

[4. The organic light emitting display apparatus of claim 3, further comprising a contact node electrically coupling the bottom capacitor electrodes to each other, and electrically coupling the top capacitor electrodes to each other, via storage opening portions defined by the top capacitor electrodes, and by the intermediate capacitor electrodes, to expose the bottom capacitor electrodes.]

[5. The organic light emitting display apparatus of claim 4, wherein the contact node is configured to apply an initialization voltage during an initialization period.]

[6. The organic light emitting display apparatus of claim 3, further comprising a driving thin film transistor (TFT) c omprising:

a gate electrode that is the bottom capacitor electrodes; and an active layer insulated from the bottom capacitor electrodes.]

[7. The organic light emitting display apparatus of claim 1, wherein the driving voltage line comprises:

a plurality of first driving voltage lines extending in a second direction crossing the first direction and configured to apply the common voltage to the pixels; and a second driving voltage line coupled to the bridge and extending in the first direction.]

[8. The organic light emitting display apparatus of claim 7, wherein the plurality of first driving voltage lines and the second driving voltage line comprise a mesh structure configuration.]

[9. The organic light emitting display apparatus of claim 7, wherein the first driving voltage lines are separated from one another and arranged symmetrically.]

*10. An organic light emitting display apparatus comprising:*

*a substrate;*

*a first scanning line extending in a first direction;*

*two pixels symmetrical to each other on the substrate and adjacent to each other in the first direction, each of the pixels comprising a pixel circuit and an organic light emitting diode (OLED);*

*two top capacitor electrodes separated from each other and symmetrical to each other, each of the top capacitor electrodes being respectively located in one of the pixel circuits;*

*two intermediate capacitor electrodes symmetrical to each other and insulated from, and overlapping with, the top capacitor electrodes; and*

*a driving voltage line configured to apply a common voltage to the intermediate capacitor electrodes.*

*11. An organic light emitting display apparatus comprising:*

*a substrate;*

*a first scanning line extending in a first direction;*

*a first pixel circuit and a second pixel circuit adjacent to each other in the first direction, wherein each of the first pixel circuit and the second pixel circuit comprises:*

*a first transistor comprising a first gate electrode and a first active layer curved below the first gate electrode;*

*a second transistor electrically connected to the first scanning line and comprising a second active layer, wherein the second active layer is integrally coupled to a first portion of the first active layer as a single body; and*

*a capacitor electrically connected to the first transistor;*

*a first data line extending in a second direction crossing the first direction and overlapping the second active layer of the second transistor of the first pixel circuit;*

*a second data line extending in the second direction and overlapping the second active layer of the second transistor of the second pixel circuit;*

*a first power voltage line extending in the second direction and overlapping the first pixel circuit, the first power voltage line being between the first data line and the second data line;*

*a second power voltage line extending in the second direction and overlapping the second pixel circuit; and*

*a connection wiring extending in the first direction between the first power voltage line and the second power voltage line and connecting the first power voltage line to the second power voltage line.*

*12. The organic light emitting display apparatus of claim 11, wherein the connection wiring, the first power voltage line, and the second power voltage line are integral as a single body.*

*13. The organic light emitting display apparatus of claim 11, wherein the first power voltage line overlaps the first gate electrode of the first transistor of the first pixel circuit, and the second power voltage line overlaps the first gate electrode of the first transistor of the second pixel circuit.*

*14. The organic light emitting display apparatus of claim 11, wherein each of the first pixel circuit and the second pixel circuit further comprises a third transistor electrically connected to the first scanning line and comprising a third active layer,*

*wherein the third active layer of the third transistor of the first pixel circuit is integrally coupled to a second portion of the first active layer of the first transistor of the first pixel circuit as a single body, and*

*wherein the third active layer of the third transistor of the second pixel circuit is integrally coupled to a second portion of the first active layer of the first transistor of the second pixel circuit as a single body.*

*15. The organic light emitting display apparatus of claim 14, wherein the first scanning line comprises:*

*first and second portions overlapping the third active layer of the third transistor of the first pixel circuit; and*

*third and fourth portions overlapping the third active layer of the third transistor of the second pixel circuit.*

*16. The organic light emitting display apparatus of claim 11, wherein the capacitor of each of the first pixel circuit and the second pixel circuit comprises:*

*a first capacitor electrode which is integral with the first gate electrode of the first transistor; and*

*a second capacitor electrode overlapping the first capacitor electrode, and wherein the second capacitor electrode of the first pixel circuit and the second capacitor electrode of the second pixel circuit are coupled to each other by a bridge.*

*17. The organic light emitting display apparatus of claim 16, wherein the bridge is integrally coupled with the second capacitor electrode of the first pixel circuit and the second capacitor electrode of the second pixel circuit as a single body.*

*18. The organic light emitting display apparatus of claim 16, further comprising an emission control line extending in the first direction,*

*wherein, in a plan view, the bridge is between the first scanning line and the emission control line.*

*19. An organic light emitting display apparatus comprising:*

*a substrate;*

*a first scanning line extending in a first direction;*

*a first pixel circuit and a second pixel circuit adjacent to each other in the first direction, wherein each of the first pixel circuit and the second pixel circuit comprises:*

*a first transistor comprising a first active layer;*

*a second transistor electrically connected to the first scanning line and comprising a second active layer, wherein the second active layer is integrally coupled to a first portion of the first active layer as a single body:*

*a third transistor electrically connected to the first scanning line and comprising a third active layer, wherein the third active layer is integrally coupled to a second portion of the first active layer as a single body;*

*a first electrode overlapping the first active layer; and a second electrode overlapping the first electrode;*

*a first data line extending in a second direction crossing the first direction and overlapping the second active layer of the second transistor of the first pixel circuit;*

*a second data line extending in the second direction and overlapping the second active layer of the second transistor of the second pixel circuit;*

*a first power voltage line extending in the second direction and overlapping the first and second electrodes of the first pixel circuit, the first power voltage line being between the first data line and the second data line; and*

*a second power voltage line extending in the second direction and overlapping the first and second electrodes of the second pixel circuit.*

*20. The organic light emitting display apparatus of claim 19, further comprising a connection wiring extending in the first direction between the first power voltage line and the second power voltage line and connecting the first power voltage line and the second power voltage line.*

*21. The organic light emitting display apparatus of claim 20, wherein the connection wiring, the first power voltage line, and the second power voltage line are integral as a single body.*

*22. The organic light emitting display apparatus of claim 19, wherein the first scanning line comprises:*

*first and second portions overlapping the third active layer of the third transistor of the first pixel circuit; and*

*third and fourth portions overlapping the third active layer of the third transistor of the second pixel circuit.*

*23. The organic light emitting display apparatus of claim 19, further comprising a bridge electrically connecting the second electrode of the first pixel circuit and the second electrode of the second pixel circuit.*

*24. The organic light emitting display apparatus of claim 23, wherein each of the first pixel circuit and the second pixel circuit comprises a capacitor electrically connected to the first transistor, and the capacitor comprises the first electrode as a first capacitor electrode and the second electrode as a second capacitor electrode,*

*wherein a width of the bridge along the second direction is less than a width of the second capacitor electrode of the capacitor of the first pixel circuit or the second capacitor electrode of the capacitor of the second pixel circuit along the second direction, and*

*wherein the bridge is integrally coupled with the second capacitor electrode of the capacitor of the first pixel circuit and the second capacitor electrode of the capacitor of the second pixel circuit as a single body.*

*25. The organic light emitting display apparatus of claim 23, further comprises an emission control line extending in the first direction,*

*wherein, in a plan view, the bridge is between the first scanning line and the emission control line.*

*26. The organic light emitting display apparatus of claim 19, wherein the first active layer includes a curved portion in a plan view.*

* * * * *